(12) United States Patent
Yu et al.

(10) Patent No.: US 9,559,067 B2
(45) Date of Patent: Jan. 31, 2017

(54) METHODS AND APPARATUS OF GUARD RINGS FOR WAFER-LEVEL-PACKAGING

(71) Applicant: Taiwan Semiconductor Manufacturing Company, Ltd., Hsin-Chu (TW)

(72) Inventors: Tsung-Yuan Yu, Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/803,221

(22) Filed: Jul. 20, 2015

(65) Prior Publication Data

US 2015/0325533 A1    Nov. 12, 2015

Related U.S. Application Data

(63) Continuation of application No. 13/419,126, filed on Mar. 13, 2012, now Pat. No. 9,099,485.

(51) Int. Cl.
| | |
|---|---|
| *H01L 23/00* | (2006.01) |
| *H01L 23/58* | (2006.01) |
| *H01L 23/485* | (2006.01) |
| *H01L 23/528* | (2006.01) |
| *H01L 21/768* | (2006.01) |
| *H01L 23/31* | (2006.01) |

(52) U.S. Cl.
CPC ....... *H01L 23/585* (2013.01); *H01L 21/76877* (2013.01); *H01L 23/3171* (2013.01); *H01L 23/485* (2013.01); *H01L 23/528* (2013.01); *H01L 23/562* (2013.01); *H01L 24/00* (2013.01); *H01L 24/03* (2013.01); *H01L 24/05* (2013.01); *H01L 2224/0401* (2013.01); *H01L 2224/05022* (2013.01); *H01L 2224/05124* (2013.01); *H01L 2224/05155* (2013.01); *H01L 2224/05166* (2013.01); *H01L 2224/05647* (2013.01); *H01L 2224/131* (2013.01); *H01L 2924/12042* (2013.01)

(58) Field of Classification Search
CPC ...................................................... H01L 23/48
See application file for complete search history.

(56) References Cited

U.S. PATENT DOCUMENTS

| | | |
|---|---|---|
| 2005/0194692 A1 | 9/2005 | Windlass et al. |
| 2009/0057922 A1 | 3/2009 | Lee et al. |
| 2010/0123219 A1* | 5/2010 | Chen .................... B23K 26/367 257/620 |

* cited by examiner

Primary Examiner — William Harriston
(74) Attorney, Agent, or Firm — Slater Matsil, LLP

(57) ABSTRACT

A method of forming a semiconductor device includes forming a passivation layer on top of a guard ring and an active area of a circuit device, forming a passivation contact within the passivation layer, the passivation contact being over and electrically connected to the guard ring, forming a post-passivation interconnect (PPI) guard ring over the passivation layer and electrically connected to the passivation contact, and forming a first polymer layer over the PPI guard ring, the first polymer layer extending along a sidewall of the PPI guard ring.

21 Claims, 5 Drawing Sheets

US 9,559,067 B2

METHODS AND APPARATUS OF GUARD RINGS FOR WAFER-LEVEL-PACKAGING

PRIORITY CLAIM AND CROSS-REFERENCE

This application is a continuation of U.S. application Ser. No. 13/419,126 entitled "Methods and Apparatus of Guard Rings for Wafer-Level-Packaging," filed Mar. 13, 2012, which application is incorporated herein by reference.

BACKGROUND

Since the invention of the integrated circuit (IC), the semiconductor industry has experienced rapid growth due to continuous improvements in the integration density of a variety of electronic components. For the most part, this improvement in integration density has come from repeated reductions in minimum feature size, which allows more components to be integrated into a given area. As the demand for even smaller electronic devices has grown, there has grown a need for smaller and more creative packaging techniques of semiconductor dies.

Conventional package technologies divide a wafer into separate dies and package each individual die; therefore, these techniques are time consuming. The trend of package technique is toward ball grid array (BGA), flip chip (FC-BGA), chip scale package (CSP), and wafer level package (WLP). Wafer level packaging technology can produce dies with extremely small dimensions and good electrical properties, and is currently widely used for its low cost and relatively simple processes.

During the manufacture and operation of the integrated circuit, the die is subjected to mechanical stress, cracks, and moisture penetrations. The stress may be especially high near the edges and the corners of the die. As the die is stressed, active devices, passive devices, and interconnects that make up the integrated circuit are also stressed, which may cause a mechanical failure of the devices or interconnects. In order to prevent such stresses and failures, a guard ring is usually manufactured around the edge of individual circuits. The guard ring on the circuit prevents stresses of the dielectric and metal layers of the circuit. However, guard ring on the circuit level may not be enough to prevent all the possible stresses and damages to the circuits in a package, particularly with WLP technology.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated below for a WLP process, interconnect structures are formed on metallization layers of a circuit device. Passivation layers are formed over the top metallization layer. Polymer layers may be formed on top of the passivation layers. Post-passivation interconnect (PPI) pads and PPI guard rings are then formed on top of the polymer layer or the passivation layers. The PPI guard rings may stop the moisture and crack penetrating into the circuit device.

Figure 1A:
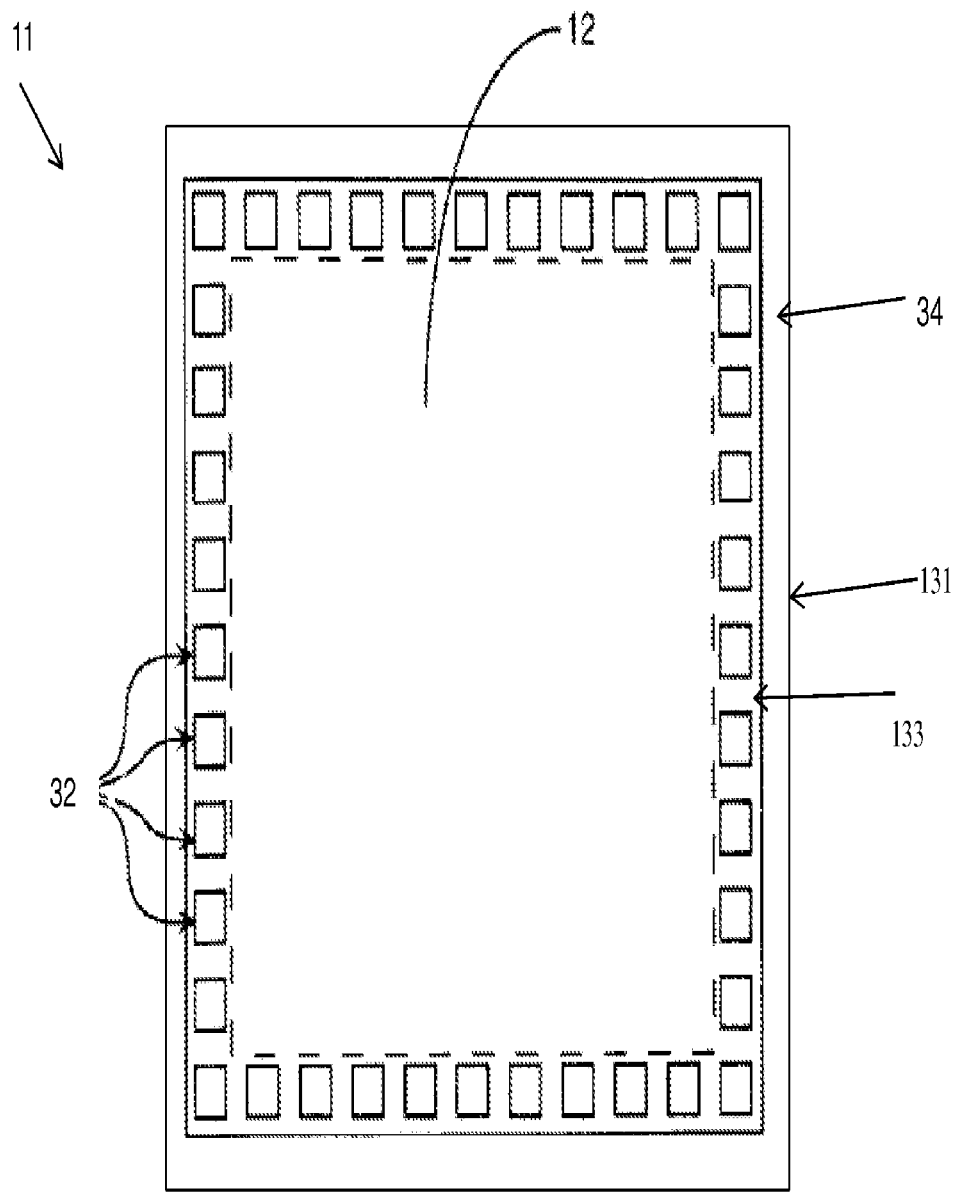
FIGS. 1(a)-1(c) illustrate a part of a wafer with scribe lines, dies with bonding pads, active areas, and circuit guard rings, covered by passivation layers.

FIG. 1(a) illustrates a surface view of the top side of an integrated circuit (IC) device 11. The circuit device 11 may be made up of millions of components such as active devices and passive devices. These components are initially isolated from each other, formed on an underlying silicon substrate, and are later interconnected together by metal interconnect lines to form the functional circuit. Typical interconnect structures include lateral interconnections, such as metal lines or wirings, and vertical interconnections, such as vias and contacts. The side of the silicon substrate on which the integrated circuit is formed may be referred to as the top side of the circuit device. An integrated circuit device may be referred as a circuit, a device, a circuit device, an integrated circuit device, a die, or in any other terms known to those skilled in the art.

As illustrated in FIG. 1(a), bond pads 32 are located along the periphery of the integrated circuit device 11. In the center of the integrated circuit device 11 is the active region 12 containing the majority of the high density, active circuitry of the integrated circuit device 11. Voltage signals may be supplied to the circuitry within the active region 12 by way of the bond pads 32. These voltage signals are supplied to the bond pads 32 through a package to which the integrated circuit device 11 is affixed.

The integrated circuit device 11 is surrounded by a guard ring region 34 where a guard ring may be formed, not shown. The guard ring region 34 may be generally referred as the guard ring 34. Guard ring is generally formed of conductive materials similar to bond pads 32, such as for example aluminum (Al), aluminum-copper (Al—Cu) alloy, or aluminum-copper-silicon (Al—Cu—Si) alloy. The guard ring 34 is placed outside of bond pads 32 and protects the integrated circuit device 11. The guard ring 34 is a circuit guard ring located on the circuit, and may be referred as a seal ring as well. The guard ring 34 has two edges, outer edge 131 is also a chip edge, while another edge 133 is adjacent to the bond pads and the active area, separating the guard ring 34 from the bond pads and the active area. For some embodiments, the size of the guard ring from one edge 131 to another edge 133 may be of a size about 10 um.

Figure 1B:
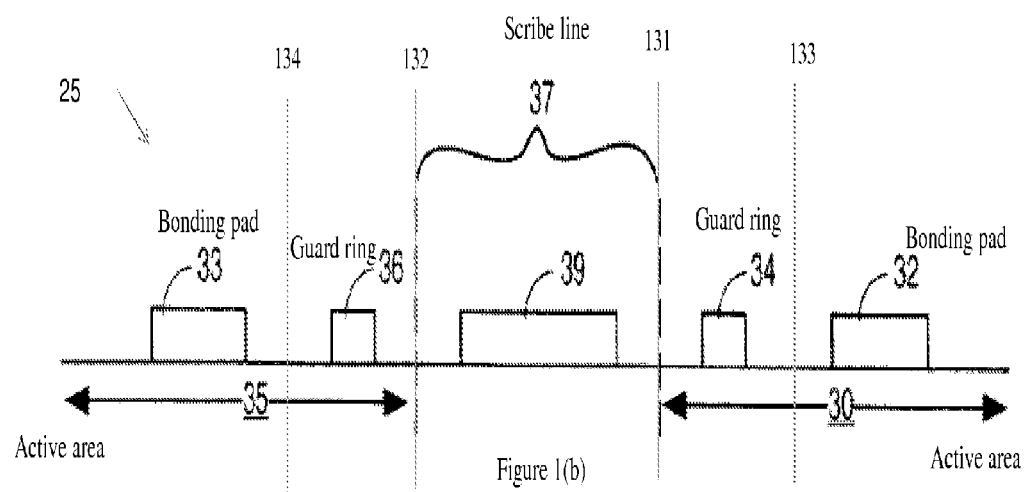

FIG. 1(b) is an expanded view of a portion of a wafer 25 showing individual integrated circuit devices 30 and 35 separated by a scribe line 37. Wafers are used as carriers for fabrication during the production of integrated circuit devices. After semiconductor fabrication processes, a plurality of dies such as 30 and 35 is formed on a wafer. These dies are later separated through a die cutting or singulation process in which typically a mechanical or laser saw is used to cut through the wafer between individual chips or dies. To facilitate the die cutting process, relatively narrow sacrificial scribe lines 37 are provided on the wafer along which the cuts are made to separate the dies. As shown in FIG. 1(b), the scribe line 37 is surrounded by two edges 131 and 132, where the edge 131 is a chip edge for the device 30 and the edge 132 is a chip edge for the device 35. The scribe line 37 may include a plurality of test pads 39 for testing the integrated circuits 30 and 35.

The integrated circuit device 30 has bond pads 32 located around the periphery of the top surface of the device, and is surrounded by a guard ring 34, where the guard ring 34 has edges 131 and 133. The edge 131 is the chip edge next to the scribe line and the edge 133 is the guard ring edge adjacent to the bond pad and the active area. Similarly, the integrated circuit device 35 has bond pads 33 located around the periphery of the top surface of the device, and is surrounded by a guard ring 36, where the guard ring 36 has edges 132 and 134. The edge 132 is the chip edge next to the scribe line and the edge 134 is the guard ring edge adjacent to the bond pad and the active area.

FIG. 1(b) shows the top conductive (e.g., metal) line of the integrated circuit devices 30 and 35. In general, after the devices are fabricated, bond pads 32 and 33 and test pad 39 lie beneath dielectric layers and must be exposed for testing and bonding to a suitable package.

Figure 1C:
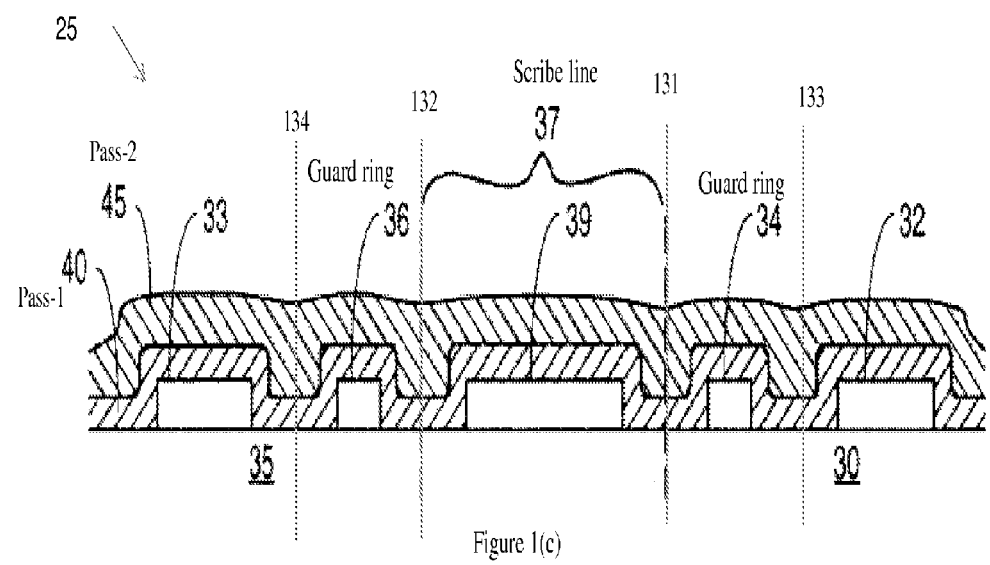

As illustrated in FIG. 1(c), the bond pads 32 and 33, the guard rings 34 and 36, and the test pads 39 may be covered by a passivation layer. A passivation layer may be formed of a non-organic material selected from un-doped silicate glass (USG), silicon nitride, silicon oxynitride, silicon oxide, and combinations thereof. The passivation layer illustrated in FIG. 1(c) may comprise a plurality of sub-layers. A first passivation layer 40 may be deposited conformal to the top metal structure of the circuits 30 and 35. The first passivation layer 40 may be made of silicon nitride. On top of the first passivation layer 40, a second passivation layer 45 may be deposited conformal to the top of the first passivation layer 40. In an embodiment, the first passivation layer 40 is formed of a relative-hard material, and the second passivation layer 45 is formed of a relative-soft material. Together, the hard and soft passivation layers protect the device from the ambient, for example, scratches, moisture, and impurities. The number of passivation layers shown in FIG. 1(c) is only for illustration purposes and is not limiting. There may be only one passivation layer, or a plurality of passivation sub-layers formed on top of the circuit devices. A passivation layer may be used to refer to a sub-layer or the overall passivation layer.

Figure 2A:
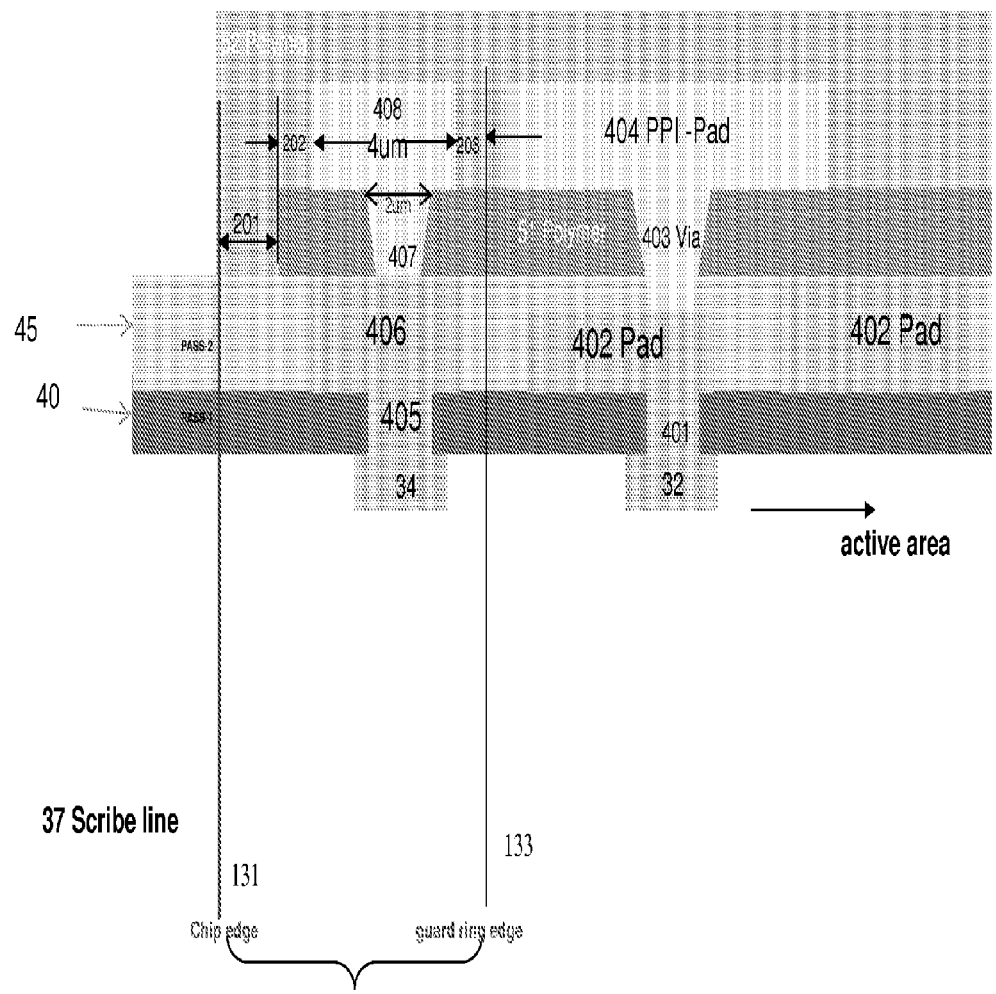
FIGS. 2(a)-2(c) illustrate various embodiments of post-passivation interconnect (PPI) guard rings on top of the passivation layers.
Figure 2B:
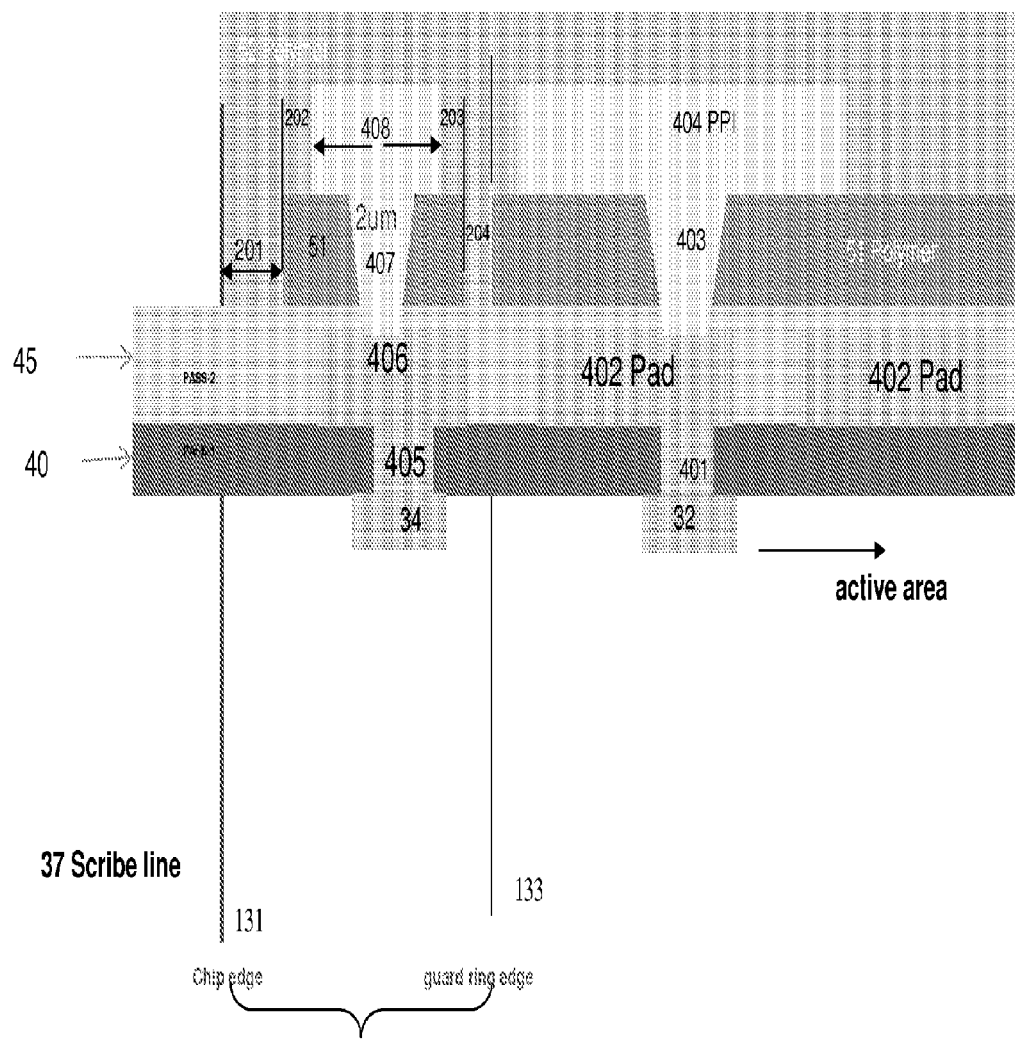
Figure 2C:
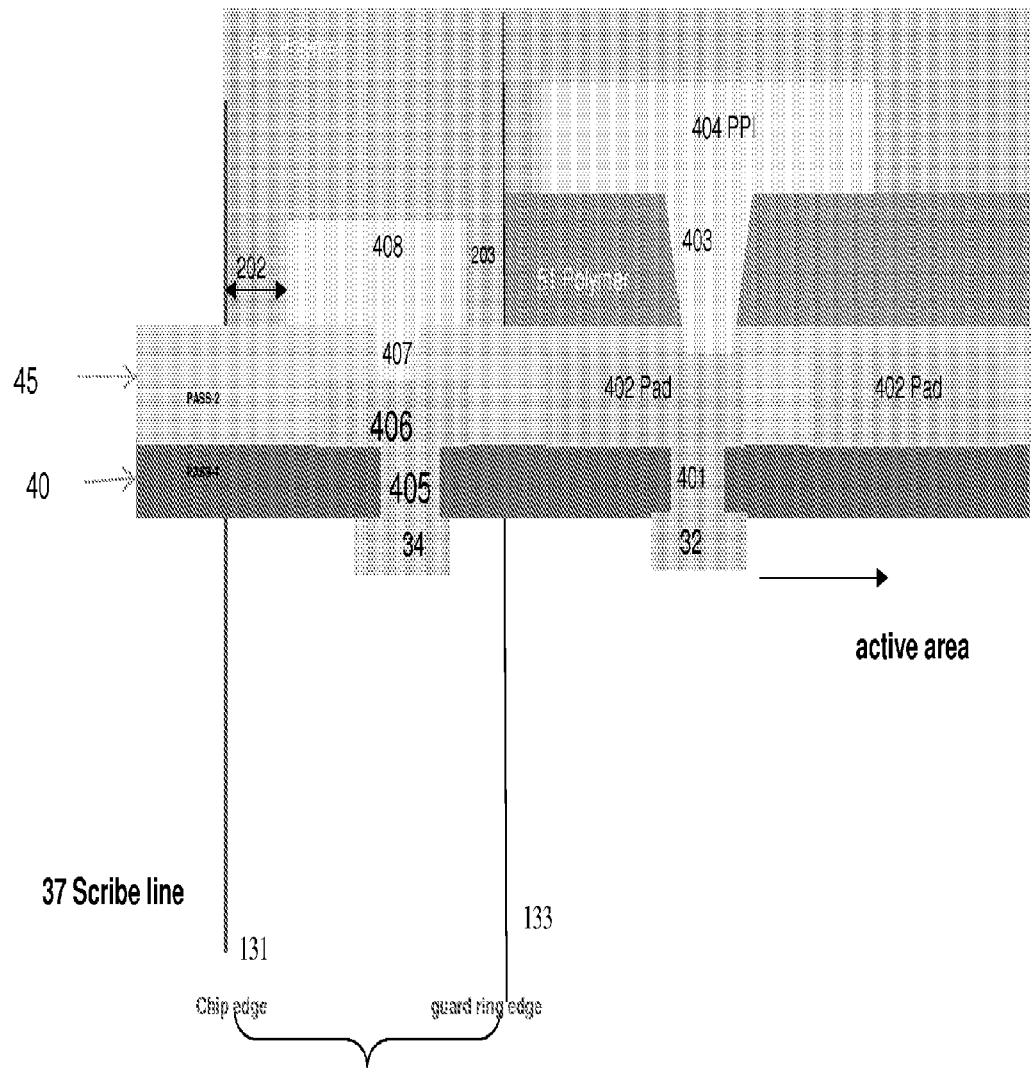

According to some embodiments of the WLP process disclosed, after a passivation layer or a plurality of passivation sub-layers are formed over the top metallization layer, as shown in FIGS. 1(a)-1(c), polymer layers may be formed on top of the passivation layers. Post-passivation interconnect (PPI) pads and PPI guard rings are then formed on top of the polymer layer or the passivation layer, which will be illustrated in FIGS. 2(a)-2(c). In order to complete the WLP process, under-bump metallurgy (UBM) layers will be formed, which is not shown. FIGS. 2(a)-2(c) illustrate only structures formed over one circuit device 30 of FIG. 1(c). Similar structures may be formed over other circuit device 35 in the wafer shown in FIG. 1(c).

Illustrated in FIG. 2(a), vias 401 and 405 are formed in the first passivation layer. In an embodiment, the via 401 is on top of the bond pad 32, and the via 405 is on top of the guard ring 34. In an embodiment, the via 401 is smaller than the size of the bond pad 32. For example, vias 401 and 405 have a size of equal to or greater than about 2 μm×2 μm. In an exemplary embodiment, the vias 401 and 405 have a size of about 3 μm×3 μm. The vias 401 and 405 may be of different sizes.

Illustrated in FIG. 2(a), pads 402 and 406 are formed in the second passivation layer 45. In an embodiment, the pad 402 is over the via 401, and the pad 406 is over the via 405. The height and width of the pads 402 and 406 may vary. The size of the pad 406 may be in a range of about 3 um to 5 um. There may be a plurality of pads 402 and some of the pad 402 may be over the active area of the circuit device.

The pad 406 and the via 405 together may be referred as a passivation contact formed within the passivation layer. Similarly the pad 402 and the via 401 may be another passivation contact formed within the passivation layer. The passivation contact of pad 406 and via 405 may be at a same height as the passivation layer surface, or it can be lower than the passivation layer surface, as shown of the pad 402 and the via 401. There may be different number of passivation layers such as one layer or more than two sub-layers. A passivation contact may be formed in various steps through the passivation sub-layers to connect the guard ring 34 or the bond pad 32 covered by the passivation layer to other contacts on top of the passivation layer. A passivation contact may be formed in one step through multiple passivation sub-layers, or in multiple steps.

A first polymer layer 51 may then be formed on top of the passivation layer 45. In an embodiment, the first polymer layer 51 is formed over the guard ring and the active areas, and not on the scribe line area as shown in FIG. 2(a). The first polymer layer 51 may be formed of a polymer, such as an epoxy, polyimide, benzocyclobutene (BCB), polybenzoxazole (PBO), and the like, although other relatively soft, often organic, dielectric materials can also be used. The formation methods include spin coating or other commonly used methods. The thickness of the first polymer layer 51 may be preferably between about 5 μm and about 30 μm. The dimensions recited throughout the description are merely examples, and will change with the down-scaling of integrated circuits. The first polymer layer 51 may stop at a point before reaching the chip edge 131, leaving a gap 201 between one end of the first polymer layer 51 and the chip edge 131. The size of the gap 201 may be about 2 um for example. The first polymer layer may reach all the way to the chip edge 131, so that the size of the gap 201 is 0.

The first polymer layer 51 may be patterned to form an opening to expose the pad 406 over the guard ring 34. The opening may be referred as a post-passivation interconnect (PPI) opening since it may be used to form a PPI structure such as a PPI guard ring or a PPI via later. The patterning of the first polymer layer 51 may include photolithography techniques. Next, the PPI opening may be filled with the metallic material to form a via 407. The size of the via 407 may be in the range of about 2 um for the diameter of the via 407. The same metallic material may further form a PPI pad 408 on top of the first polymer layer 51. The formation methods include plating, electroless plating, sputtering, chemical vapor deposition methods, and the like. The filling material for the via 407 and the PPI pad 408 includes copper or copper alloys. Other metals, such as aluminum, silver, gold, and combinations thereof, may also be included.

The PPI pad 408 and the via 407 together may be referred to as a post-passivation interconnect (PPI) guard ring over the guard ring 34. The PPI guard ring is on top of the passivation contact comprising pad 406 and via 405. The PPI pad 408 is the part of the PPI guard ring on top of the first polymer layer 51. The edge of the PPI pad 408 may have a distance 202 to the edge of the first polymer layer 51 on one side, and another distance 203 to the guard ring edge 133 on the other side. The two distances 202 and 203 may be of the same or similar sizes, in the range of 2 um for example. The PPI pad 408 may be of a rectangle shape or a square shape, with one side of size around 4 um. For example, the PPI pad 408 may have a thickness of less than about 30 μm, or a thickness between about 2 μm and about 10 μm.

Similarly, the first polymer layer 51 may be patterned to form another PPI opening to expose the pad 402 within the passivation layer over the bond pad 32. The opening shown in FIG. 2(a) may extend into the passivation layer since the surface of the pad 402 is lower than the surface of the passivation layer 45. Next, the opening may be filled with the metallic material to form a via 403, which is partially into the passivation layer 45. The same metallic material may further form a pad 404 on top of the first polymer layer 51. The size of the vias 403 and 407 may be of similar sizes of vias 401 and 405. They may be of different sizes as well. The pad 404 may be referred to as post-passivation interconnect (PPI) pad. The PPI pad 404 may be used to connect the bonding pad 32 to solder balls in the package.

A second polymer layer 52 is then formed and patterned on top of the first polymer layer 51, on top of the PPI pads 404 and 408. The second polymer layer 52 extends to the chip edge, and not over the scribe line. The second polymer layer 52 may also include a polymer selected from an epoxy, polyimide, BCB, and PBO, and may be patterned using the same method as patterning the first polymer layer 51.

Other additional layers such as UBM seed layer may be blanket formed, which may include a titanium layer and a copper seed layer on titanium layer. Alternatively UBM seed layer may include layers selected from a chromium copper layer on a chromium layer, a copper layer on a titanium tungsten layer, a nickel vanadium layer on an aluminum layer, a nickel vanadium layer on a titanium layer, or other combinations of the above-mentioned layers. The UBM layer is over the second polymer layer and may be electrically connected to the PPI pad 404 which is further connected to the bond pad 32 of the circuit.

FIG. 2(b) illustrates another embodiment of a PPI guard ring formed on top of the guard ring 34. A passivation contact comprising a pad 406 and a via 405 may be formed within the passivation layers 40 and 45. A first polymer layer 51 may be formed on top of the passivation layer 45. Different from the embodiment shown in FIG. 2(a), the first polymer layer 51 comprising two parts discontinuous from each other. A first part of the first polymer layer 51 is over the guard ring, which is discontinuous from a second part of the first polymer layer 51 which ends at an edge of the guard ring and over the active area. There is a gap 204 between the two parts of the first polymer layer 51. The size of the gap may be about a size of 2 um. The discontinuous two parts of the first polymer layer 51 can further stop the crack and moisture penetration into the active area of the circuit.

Illustrated in FIG. 2(b), the first polymer layer 51 may be patterned to form a PPI opening to expose the pad 406 and via 405 on top of the guard ring 34. The PPI opening may go through the first polymer layer 51 and extends into the passivation layer 45. Therefore the PPI opening may be filled with the metallic material to form a via 407 which is partially within the passivation layer. The same metallic material may further form a PPI pad 408 on top of the first polymer layer 51. The PPI pad 408 and the via 407 may be referred to as post-passivation interconnect (PPI) guard ring over the circuit guard ring 34, which are on top of the passivation contact of pad 406 and via 405. The PPI pad 408 is the part of the PPI guard ring on top of the first polymer layer 51. Other parts of FIG. 2(b) are similar to the descriptions of FIG. 2(a).

FIG. 2(c) illustrates another embodiment of a PPI guard ring formed on top of the circuit guard ring 34. A passivation contact comprising a pad 406 and a via 405 may be formed within the passivation layers 40 and 45. A first polymer layer 51 may be formed on top of the passivation layer 45. Different from the embodiments shown in FIGS. 2(a) and 2(b), the first polymer layer 51 stops at the guard ring edge and does not extend to the guard ring area. A PPI opening may be formed directly in the passivation layer 45 to expose the pad 406 and via 405 on top of the guard ring 34. Then the PPI opening may be filled with the metallic material to form a via 407 which is within the passivation layer 45. The same metallic material may further form a PPI pad 408 on top of the passivation layer 45. The PPI pad 408 and the via 407 may be referred to as a post-passivation interconnect (PPI) guard ring. The PPI guard ring may be made of copper, copper alloys. aluminum, silver, gold, or combinations thereof. The PPI guard ring is on top of the passivation contact of pad 406 and via 405 over the circuit guard ring 34. The PPI pad 408 is the part of the PPI guard ring on top of the passivation layer 45. An edge of the PPI guard ring over the passivation layer, which is an edge of the PPI pad 408, has a distance about 2 um or bigger to an edge of the first polymer layer, shown as the distance 203. Similar distance may be formed for another edge of the PPI pad 408 to the chip edge, shown as the distance 202.

The first polymer layer 51 over the active area may be patterned to form a PPI opening to expose the pad 402 and via 401 within the passivation layer on top of the bond pad 32. The opening shown in FIG. 2(c) may extend into the passivation layer since the surface of the pad 402 is lower than the surface of the passivation layer 45. Next, the opening may be filled with the metallic material to form a via 403, which is partially into the passivation layer 45. The same metallic material may further form a pad 404 on top of the first polymer layer 51. The size of the vias 403 and 407 may be of similar sizes of vias 401 and 405. They may be of different sizes as well. The pad 404 may be referred to as post-passivation interconnect (PPI) pad. The PPI pad 404 may be used to connect the bonding pad 32 to solder balls in the package. Other parts of FIG. 2(c) are similar to the descriptions of FIG. 2(a).

In accordance with some embodiments, a method of forming a semiconductor device includes forming a passivation layer on top of a guard ring and an active area of a circuit device, forming a passivation contact within the passivation layer, the passivation contact being over and electrically connected to the guard ring, forming a post-passivation interconnect (PPI) guard ring over the passivation layer and electrically connected to the passivation contact, and forming a first polymer layer over the PPI guard ring, the first polymer layer extending along a sidewall of the PPI guard ring.

In accordance with other embodiments, a method of forming a semiconductor device includes providing a circuit device having a guard ring around an active area of the circuit device, forming a passivation layer over the guard ring and the active area, and forming a passivation contact within the passivation layer, the passivation contact electrically connected to the guard ring. The method further includes forming a first polymer layer over the passivation layer, the first polymer layer extends over at least the active area, and forming a post-passivation interconnect (PPI) guard ring over the passivation contact, the PPI guard ring electrically connected to the passivation contact.

In accordance with yet other embodiments, a semiconductor device includes a circuit device having a guard ring around an active area of the circuit device, a passivation layer over the guard ring and the active area, and a passivation contact within the passivation layer, the passivation contact electrically connected to the guard ring. The semiconductor device further includes a first polymer layer over the passivation layer, the first polymer layer extending over at least the active area, a post-passivation interconnect (PPI) guard ring over the passivation contact and electrically connected to the passivation contact, and a second polymer layer directly on the first polymer layer and the PPI guard ring.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a first passivation layer on top of a guard ring and an active area of a circuit device;
    forming a passivation contact within the first passivation layer, the passivation contact being over and electrically connected to the guard ring;
    forming a first polymer layer over the first passivation layer, wherein the first polymer layer extends over the active area of the circuit device but does not extend over the guard ring;
    after forming the first polymer layer, forming a post-passivation interconnect (PPI) guard ring over the first passivation layer and electrically connected to the passivation contact, wherein the PPI guard ring is conductive, and wherein the PPI guard ring is formed directly on the first passivation layer; and
    forming a second polymer layer over the PPI guard ring, the second polymer layer extending over a top surface and along a sidewall of the PPI guard ring.

2. The method of claim 1, wherein the PPI guard ring extends into the first passivation layer to connect with the passivation contact.

3. The method of claim 1, wherein a distance from an edge of the PPI guard ring to an edge of the first polymer layer is about 2 µm.

4. The method of claim 1, wherein a distance from an edge of the PPI guard ring to an edge of the first polymer layer is greater than about 2 µm.

5. The method of claim 1, wherein a distance from an edge of the PPI guard ring to an edge of the circuit device is about 2 µm.

6. The method of claim 1, wherein a distance from an edge of the PPI guard ring to an edge of the circuit device is greater than about 2 µm.

7. The method of claim 1, wherein a distance from an edge of the PPI guard ring to an edge of the first polymer layer is a same distance as a distance from an edge of the PPI guard ring to an edge of the circuit device.

8. The method of claim 1, further comprising forming a second passivation layer prior to forming the first passivation layer, the first passivation layer being formed on the second passivation layer, wherein the first passivation layer is harder than the second passivation layer.

9. A method of forming a semiconductor device, the method comprising:
    providing a circuit device having a guard ring around an active area of the circuit device;
    forming a passivation layer over the guard ring and the active area;
    forming a passivation contact within the passivation layer, the passivation contact electrically connected to the guard ring;
    forming a first polymer layer over the passivation layer, the first polymer layer extends over at least the active area, wherein the first polymer layer further extends over the guard ring, wherein the first polymer layer comprises a first part over the guard ring and a second part over the active area, wherein the first part is separate from the second part; and
    forming a post-passivation interconnect (PPI) guard ring over the passivation contact, the PPI guard ring electrically connected to the passivation contact, an entirety of the PPI guard ring being above the passivation contact.

10. The method of claim 9, further comprising:
    forming a second polymer layer over the PPI guard ring and the first polymer layer.

11. The method of claim 9, wherein the forming the PPI guard ring further comprises:
    forming a PPI opening within the first polymer layer over the passivation contact; and
    filling the PPI opening with a conductive material to form the PPI guard ring, wherein the PPI guard ring contacts the passivation contact and extends on top of the first polymer layer.

12. The method of claim 9, wherein a first edge of the PPI guard ring is a first distance away from a first edge of the first part of the first polymer layer, and a second edge of the PPI guard ring is a second distance away from a second edge of the first part of the first polymer layer.

13. The method of claim 9, wherein the passivation layer comprises a plurality of layers, and wherein the forming the passivation layer further comprises:
    forming a first passivation layer; and
    forming a second passivation layer over the first passivation layer.

14. The method of claim 13, wherein at least one of the first and the second passivation layers is conformally formed.

15. The method of claim 9, wherein a distance from an edge of the PPI guard ring to an edge of the first polymer layer is greater than or equal to about 2 µm.

16. The method of claim 9, wherein a distance between the first part and the second part is about 2 µm.

17. The method of claim 9, wherein a thickness of the PPI guard ring is between about 2 µm and 10 µm.

18. A semiconductor device comprising:
    a circuit device having a guard ring around an active area of the circuit device;
    a passivation layer over the guard ring and the active area;

a passivation contact within the passivation layer, the passivation contact electrically connected to the guard ring;

a first polymer layer over the passivation layer, the first polymer layer extending over at least the active area, the first polymer layer not extending over the guard ring;

a post-passivation interconnect (PPI) guard ring over the passivation contact and electrically connected to the passivation contact; and a second polymer layer directly on the first polymer layer and the PPI guard ring.

19. The semiconductor device of claim 18, wherein an edge of the PPI guard ring has a distance about at least 2 µm to an edge of the first polymer layer.

20. The semiconductor device of claim 18, further comprising a PPI pad on top of the first polymer layer connected to a bonding pad of the circuit device, and an under-bump metallurgy (UBM) layer directly over the second polymer layer electrically connected to the PPI pad.

21. A method of forming a semiconductor device, the method comprising:

providing a circuit device having a guard ring around an active area of the circuit device;

forming a passivation layer over the guard ring and the active area;

forming a passivation contact within the passivation layer, the passivation contact electrically connected to the guard ring;

forming a first polymer layer over the passivation layer, the first polymer layer extends over at least the active area, wherein the first polymer layer extends over the active area but not the guard ring; and forming a post-passivation interconnect (PPI) guard ring over the passivation contact, the PPI guard ring electrically connected to the passivation contact.

* * * * *